(12) United States Patent  
Sin (10) Patent No.: US 12,356,540 B2  
(45) Date of Patent: Jul. 8, 2025

(54) PRINTED CIRCUIT BOARD AND IMAGE DISPLAY DEVICE INCLUDING SAME

(71) Applicant: LG ELECTRONICS INC., Seoul (KR)

(72) Inventor: Geumsub Sin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/255,686

(22) PCT Filed: Dec. 2, 2020

(86) PCT No.: PCT/KR2020/017418  
§ 371 (c)(1),  
(2) Date: Jun. 2, 2023

(87) PCT Pub. No.: WO2022/118994  
PCT Pub. Date: Jun. 9, 2022

(65) Prior Publication Data  
US 2024/0373547 A1 Nov. 7, 2024

(51) Int. Cl.  
*H05K 1/02* (2006.01)  
*H05K 1/11* (2006.01)

(52) U.S. Cl.  
CPC ......... *H05K 1/0257* (2013.01); *H05K 1/0218* (2013.01); *H05K 1/115* (2013.01); *H05K 2201/10174* (2013.01)

(58) Field of Classification Search  
CPC .... H05K 1/0257; H05K 1/0218; H05K 1/115; H05K 2201/10174; H05K 2201/0738;  
(Continued)

(56) References Cited

U.S. PATENT DOCUMENTS 6,147,853 A * 11/2000 Berthiot ................ H10D 89/60  
                                                    361/111  
6,304,126 B1 * 10/2001 Berthiot ................ H02H 9/041  
                                                    361/111  
(Continued)

FOREIGN PATENT DOCUMENTS

GB       2419034 A * 4/2006 ............. H01C 13/02  
JP        09-232714      9/1997  
(Continued)

OTHER PUBLICATIONS

PCT International Application No. PCT/KR2020/017418 International Search Report dated Aug. 30, 2021, 2 pages.

*Primary Examiner* — Dharti H Patel  
(74) *Attorney, Agent, or Firm* — LEE, HONG, DEGERMAN, KANG & WAIMEY (57) ABSTRACT

The present invention relates to a printed circuit board and an image display device including same. The printed circuit board according to an embodiment of the present invention includes a power pattern layer, a ground pattern layer, and a wiring pattern layer on which circuit elements are disposed, wherein the wiring pattern layer includes a signal line pattern through which an electrical signal is transmitted, and a ground pattern electrically disconnected from the signal line pattern and having at least one via hole formed therein which is electrically connected to the ground pattern layer, wherein the signal line pattern comes into contact with a first end of an overvoltage cutoff element that operates in response to an overvoltage, greater than or equal to a predetermined voltage value, being applied to the signal line pattern, wherein the ground pattern includes a first detailed pattern coming into contact with a second end of the overvoltage cutoff element, a second detailed pattern having the via-hole formed therein, and a plurality of third detailed patterns electrically connecting the first detailed pattern and (Continued)

the second detailed pattern, wherein the via hole is formed in a remaining region except for a plurality of first regions of the second detailed pattern that extend from each of the third detailed patterns in a length direction of each of the plurality of third detailed patterns. Various other embodiments are possible.

8 Claims, 8 Drawing Sheets

(58) Field of Classification Search
CPC ....... H05K 2201/09363; H05K 1/0259; H02H 9/046
USPC ......................................................... 361/91.5
See application file for complete search history.

(56) References Cited

U.S. PATENT DOCUMENTS

| | | | | |
|---|---|---|---|---|
| 6,456,472 | B1* | 9/2002 | Beriault | H10D 89/611 |
| | | | | 361/56 |
| 8,917,033 | B2* | 12/2014 | Xu | H05B 45/52 |
| | | | | 315/306 |
| 9,153,951 | B2* | 10/2015 | Park | H02H 9/043 |
| 10,270,240 | B2* | 4/2019 | Bandel | H02H 3/00 |
| 11,296,497 | B2* | 4/2022 | Cai | H02H 9/04 |
| 11,545,827 | B2* | 1/2023 | Lu | H02H 9/026 |
| 12,136,513 | B2* | 11/2024 | Cantrell | H01F 27/402 |
| 12,158,490 | B2* | 12/2024 | Wang | G01R 31/2617 |
| 2004/0109275 | A1* | 6/2004 | Whitney | H01C 7/021 |
| | | | | 361/93.1 |
| 2013/0314833 | A1* | 11/2013 | Smith | H02H 7/20 |
| | | | | 361/91.5 |
| 2015/0207314 | A1* | 7/2015 | Tournier | H02H 9/041 |
| | | | | 361/91.5 |
| 2016/0029479 | A1* | 1/2016 | Yoo | H05K 1/0259 |
| | | | | 361/56 |
| 2020/0053868 | A1* | 2/2020 | Park | H05K 1/0277 |

FOREIGN PATENT DOCUMENTS

| | | |
|---|---|---|
| JP | 2005223201 | 8/2005 |
| JP | 2018088509 | 6/2018 |
| JP | 2019129240 | 8/2019 |
| JP | 2020013632 | 1/2020 |

\* cited by examiner

PRINTED CIRCUIT BOARD AND IMAGE DISPLAY DEVICE INCLUDING SAME

CROSS-REFERENCE TO RELATED APPLICATION(S)

This application is the National Stage filing under 35 U.S.C. 371 of International Application No. PCT/KR2020/017418, filed on Dec. 2, 2020, the contents of which are all incorporated by reference herein in its entirety.

TECHNICAL FIELD

The following description relates to a printed circuit board (PCB) on which circuit elements are mounted, and an image display device including the PCB.

BACKGROUND ART

Recently, with the development of technology, various electronic devices, such as home appliances including TV sets, air conditioners, etc. which are used for user convenience in specific spaces at home or office and the like, or mobile devices such as smartphones and the like, have been developed and are available on the market.

The electronic device includes many circuit elements to operate according to its purpose, in which the circuit elements are generally mounted on a PCB to perform their own functions.

Generally, in many cases the electronic device receives power from an external source and is connected to an external device through a cable and the like to transmit and receive signals with the external device. In this case, a surge current may flow into the electronic device during supply of power from the external source, and static electricity generated during connection with the external device may be transmitted to the circuit elements via a signal line of the PCB, in which the circuit elements or system may be subject to electrical over-stress (EOD) damage due to the surge supplied from the external source or static electricity and the like, such that a method for preventing the occurrence is required.

Conventionally, components, such as a relay for cutting off power supply from an external source and the like, are added to the electronic device to prevent the surge from entering, or the PCB is designed and configured in which the PCB includes elements, such as a varistor for clamping a voltage of a signal line, to which the circuit elements are connected, to a predetermined value or less when an overvoltage is applied, so that a large amount of current may flow to the ground when an overvoltage is applied.

However, even when a circuit pattern of the PCB is designed so that a current flows to the ground when an overvoltage is applied, there may be a case where the current flows to the signal line without flowing sufficiently to the ground due to a pattern structure formed on a pattern layer in an actual circuit implementation, or the impedance of a via hole, or the like, thereby causing a problem in that damage to the circuit elements mounted on the PCB or the system cannot be prevented.

DISCLOSURE OF INVENTION

Technical Problem

It is an objective of the present disclosure to solve the above and other problems.

It is another objective of the present disclosure to provide a printed circuit board (PCB) configured so that a current flowing through an overvoltage cutoff element may flow sufficiently to the ground when an overvoltage is applied, and an image display device including the PCB.

Technical Solution

In order to achieve the above objectives, a printed circuit board according to an embodiment of the present disclosure includes a power pattern layer, a ground pattern layer, and a wiring pattern layer on which circuit elements are disposed, wherein the wiring pattern layer includes a signal line pattern through which an electrical signal is transmitted, and a ground pattern electrically disconnected from the signal line pattern and having at least one via hole formed therein which is electrically connected to the ground pattern layer, wherein the signal line pattern comes into contact with a first end of an overvoltage cutoff element that operates in response to an overvoltage, greater than or equal to a predetermined voltage value, being applied to the signal line pattern, wherein the ground pattern includes a first detailed pattern coming into contact with a second end of the overvoltage cutoff element, a second detailed pattern having the via-hole formed therein, and a plurality of third detailed patterns electrically connecting the first detailed pattern and the second detailed pattern, wherein the via hole is formed in a remaining region except for a plurality of first regions of the second detailed pattern that extend from each of the third detailed patterns in a length direction of each of the plurality of third detailed patterns.

Meanwhile, in order to achieve the above objectives, an image display device according to an embodiment of the present disclosure includes a display, an external device interface configured to transmit and receive data with an external device, and a power supply configured to supply power, wherein the external device interface includes a printed circuit board having a power pattern layer to which power supplied from the power supply is input, a ground pattern layer, and a wiring pattern layer on which circuit elements are disposed, wherein the wiring pattern layer includes a power line pattern in which at least one first via hole electrically connected to the power pattern layer is formed, and which is connected to the external device, a signal line pattern through which an electrical signal including the data is transmitted, and a ground pattern in which at least one second via hole electrically connected to the ground pattern layer is formed, wherein the signal line pattern comes into contact with a first end of an overvoltage cutoff element that operates in response to an overvoltage, greater than or equal to a predetermined voltage value, being applied to the signal line pattern, wherein the ground pattern includes a first detailed pattern coming into contact with a second end of the overvoltage cutoff element, a second detailed pattern having the second via-hole formed therein, and a plurality of third detailed patterns electrically connecting the first detailed pattern and the second detailed pattern, wherein the second via hole is formed in a remaining region except for a plurality of first regions of the second detailed pattern that extend from each of the third detailed patterns in a length direction of each of the plurality of third detailed patterns.

Advantageous Effects of Invention

The printed circuit board according to the present disclosure has the following effects.

According to various embodiments of the present disclosure, the effect of impedance of a via hole on a current flowing to the ground through an overvoltage cutoff element may be reduced, such that when an overvoltage is applied, the current flowing through the overvoltage cutoff element may flow sufficiently to the ground pattern and the ground pattern layer.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 4A to 6 are diagrams referred to in the description of wiring pattern layers of a PCB, according to an embodiment of the present disclosure.

MODE FOR THE INVENTION

Hereinafter, the present disclosure will be described in detail with reference to the accompanying drawings. In order to clearly and briefly describe the present disclosure, components that are irrelevant to the description will be omitted in the drawings, and the same or extremely similar elements are designated by the same reference numerals throughout the specification.

Hereinafter, the present disclosure will be described in detail with reference to the accompanying drawings. In order to clearly and briefly describe the present disclosure, components that are irrelevant to the description will be omitted in the drawings, and the same or extremely similar elements are designated by the same reference numerals throughout the specification.

The suffixes, such as "module" and "unit," for elements used in the following description are given simply in view of the ease of the description, and do not have any specific meaning or function. Therefore, the "module" and "unit" may be used interchangeably.

It should be understood that the terms "comprise", 'include", "have", etc. when used in this specification, specify the presence of stated features, integers, steps, operations, elements, components, or combinations thereof but do not preclude the presence or addition of one or more other features, integers, steps, operations, elements, components, or combinations thereof.

In addition, it will be understood that although the terms first, second, etc. may be used herein to describe various elements, these elements should not be limited by these terms. These terms are only used to distinguish one element from another.

Figure 1:
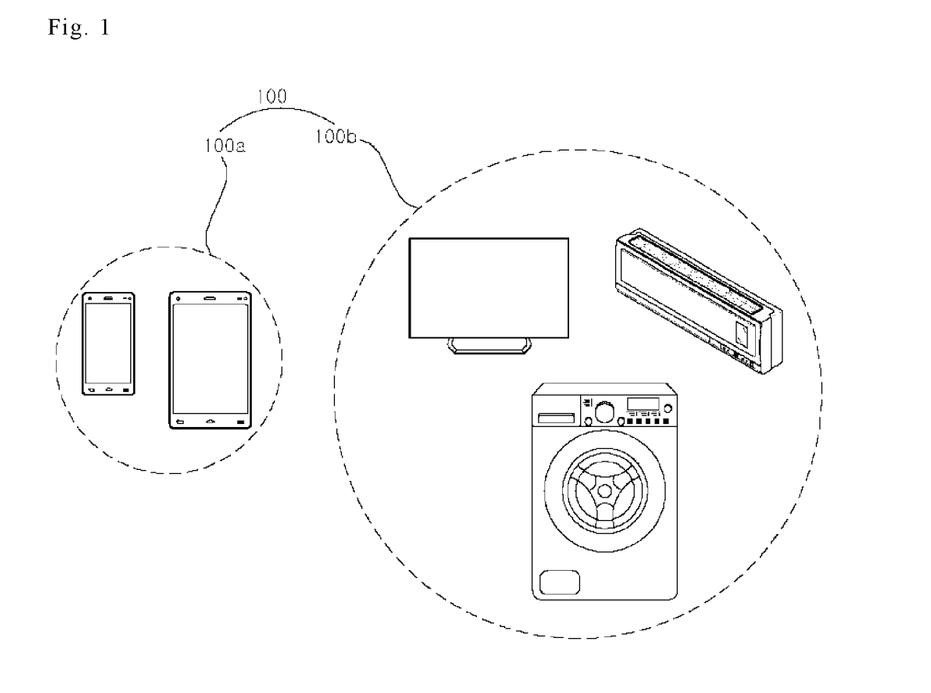
FIG. 1 is a diagram illustrating examples of an electronic device including a printed circuit board (PCB), according to various embodiments of the present disclosure.
Figure 2:
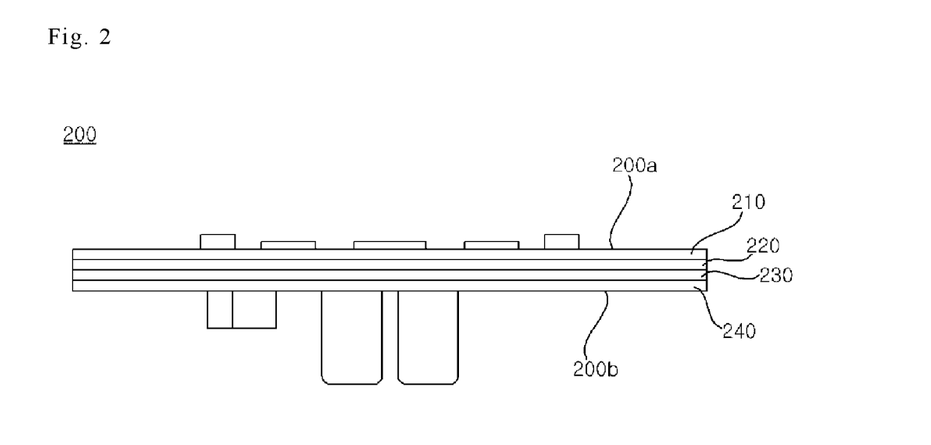
FIG. 2 is a diagram illustrating an example of the PCB included in the electronic device of FIG. 1.

FIG. 1 is a diagram illustrating examples of an electronic device including a printed circuit board (PCB), according to various embodiments of the present disclosure, and FIG. 2 is a diagram illustrating an example of the PCB included in the electronic device of FIG. 1.

Referring to FIGS. 1 and 2, examples of an electronic device 100 may include a mobile device 100b such as a smartphone, a tablet PC, etc., a home appliance 100b such as an image display device, an air conditioner, a washing machine, and the like.

The electronic device 100 may include various PCBs 200 on which a plurality of circuit elements 10 are mounted, and the electronic device 100 may perform its own unique function and operation by using power supplied from an external source and/or power stored in an internal battery.

The PCB 200 may be a laminated structure of a plurality of pattern layers 210 to 240 that are stacked in a predetermined order.

Each of the plurality of pattern layers 210 to 240 may include a plurality of patterns. Here, the plurality of patterns may refer to patterns of conductors which are formed of conductive materials, including one or more of copper (Cu), aluminum (Al), nickel (Ni), palladium (Pd), silver (Ag), chromium (Cr), titanium (Ti), and gold (Au), and which are printed on the respective pattern layers.

The plurality of pattern layers 210 to 240 may be electrically connected to each other through a via hole and/or a through hole for electrical connection between the respective pattern layers. For example, the respective patterns of the plurality of pattern layers 210 to 240 may be electrically connected to each other through the via hole.

A power pattern layer 220 and a ground pattern layer 230 may be formed in the PCB 200.

Wiring pattern layers 210 and 240 may be disposed respectively on an upper surface 200a and a lower surface 200a of the PCB 200, and a plurality of circuit elements 10 may be mounted on the wiring pattern layers 210 and 240. While it is illustrated in this figure that the wiring pattern layers 210 and 240 are disposed on both surfaces of the PCB 200, the present disclosure is not limited thereto, and may be disposed on any one of the upper surface 200a and the lower surface 200b of the PCB 200.

The circuit elements 10 mounted on the PCB 200 may be joined by soldering to first surfaces 210a and 240a of the respective wiring pattern layers 210 and 240. Here, a solder for joining that is applied to join the circuit elements 10 may be made of alloy powder and flux in consideration of electrical conductivity and adhesiveness.

FIGS. 3A to 3D are diagrams referred to in the description of an overvoltage cutoff element included in a PCB.

Figure 3A:
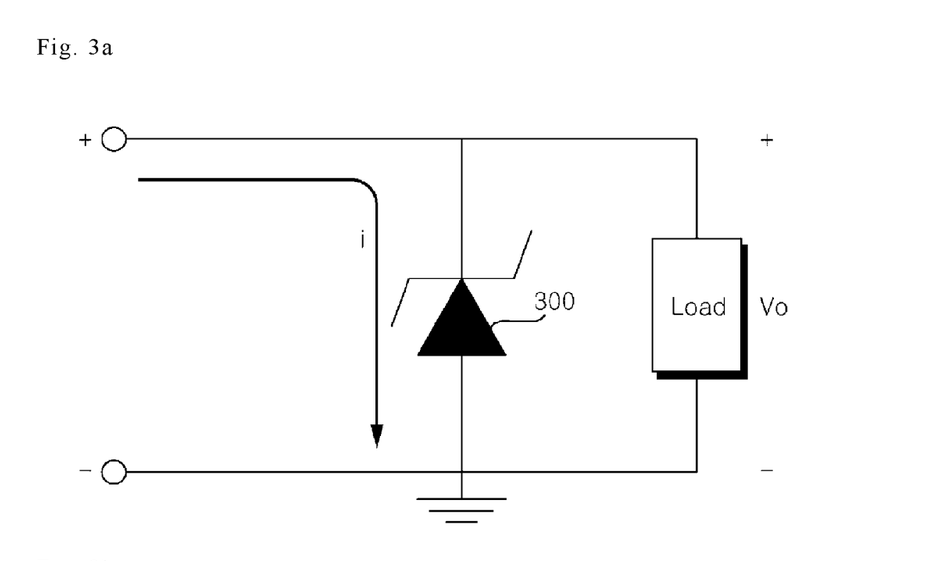
FIGS. 3A to 3D are diagrams referred to in the description of an overvoltage cutoff element included in a PCB.

Referring to FIG. 3A, an overvoltage cutoff element 300 may be mounted on a pattern formed on the wiring pattern layers 210 and 240. For example, the overvoltage cutoff element 300 may include a Transient-voltage-suppression (TVS) diode in which impedance drops rapidly, so that when an overvoltage is applied, a current i flowing through the pattern may flow through the overvoltage cutoff element 300.

Figure 3B:
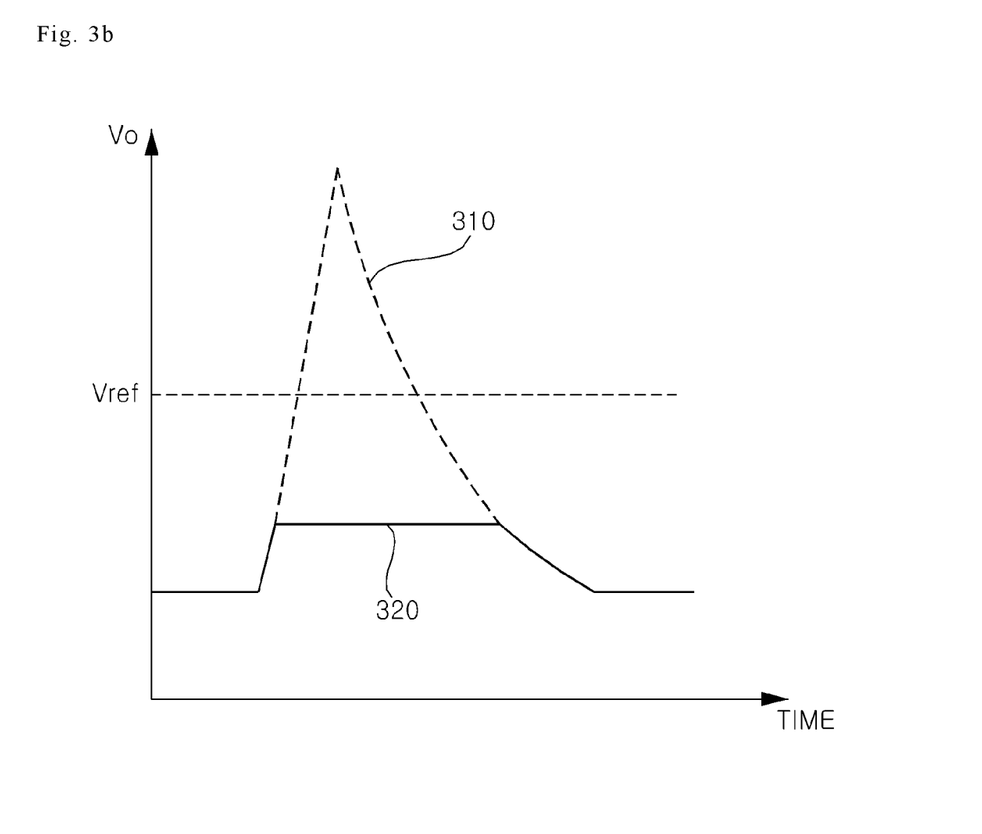
Figure 3C:
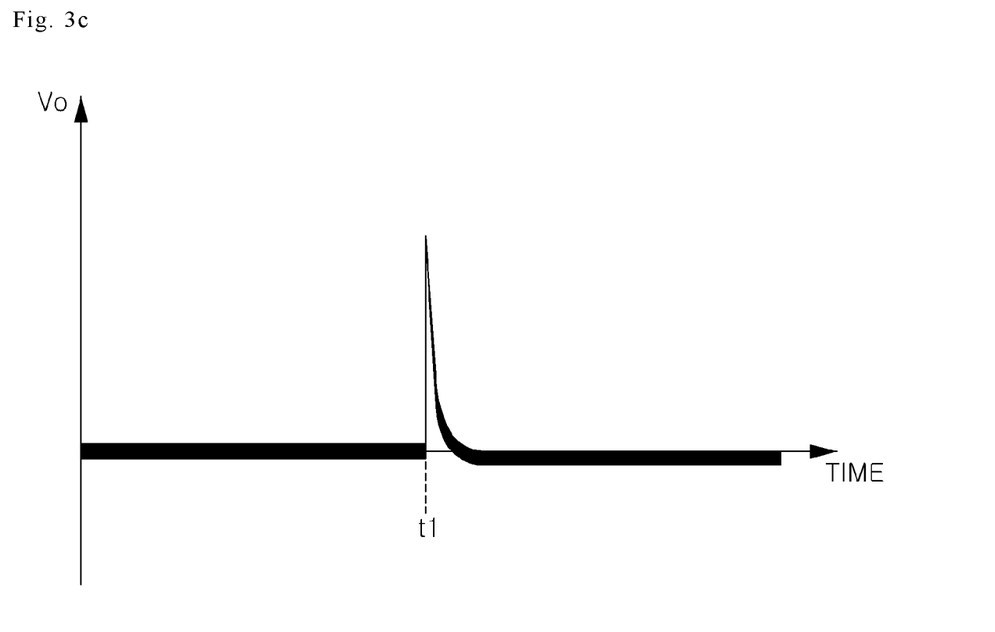
Figure 3D:
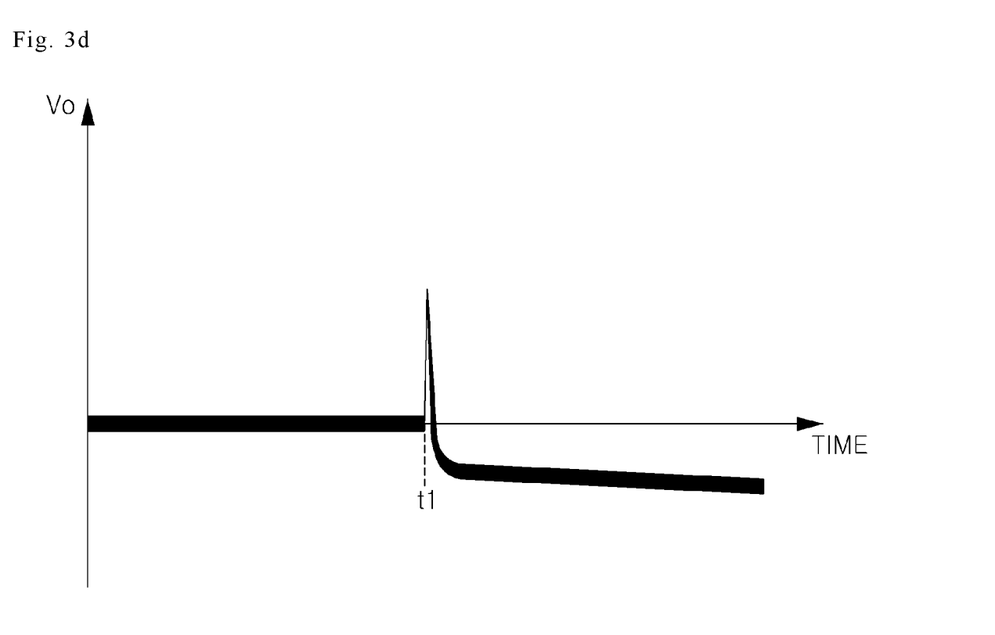

Referring to FIG. 3B, in a case (310) where an overvoltage greater than or equal to a predetermined voltage value Vref is applied to a pattern having the overvoltage cutoff element 300 joined thereto, a voltage Vo applied to the pattern may be clamped to a predetermined voltage value or less (320) according to a change in impedance of the overvoltage cutoff element 300.

In this case, even when the pattern and the via hole are formed on the wiring pattern layers 210 and 240 of the PCB 200 according to a circuit design as illustrated in FIG. 3A, there may be a case where when an overvoltage is applied, the current i flowing through the pattern of the wiring pattern layers 210 and 240 may not flow sufficiently to the ground pattern layer 230 through the overvoltage cutoff element 300 due to an actual pattern structure or impedance of the via hole or the like. In this case, since the voltage Vo applied to the pattern may not be clamped to a predetermined voltage value or less, the overvoltage may be applied to another circuit element of the wiring pattern layers 210 and 240.

FIGS. 4A to 6 are diagrams referred to in the description of wiring pattern layers of a PCB, according to an embodiment of the present disclosure.

Figure 4A:
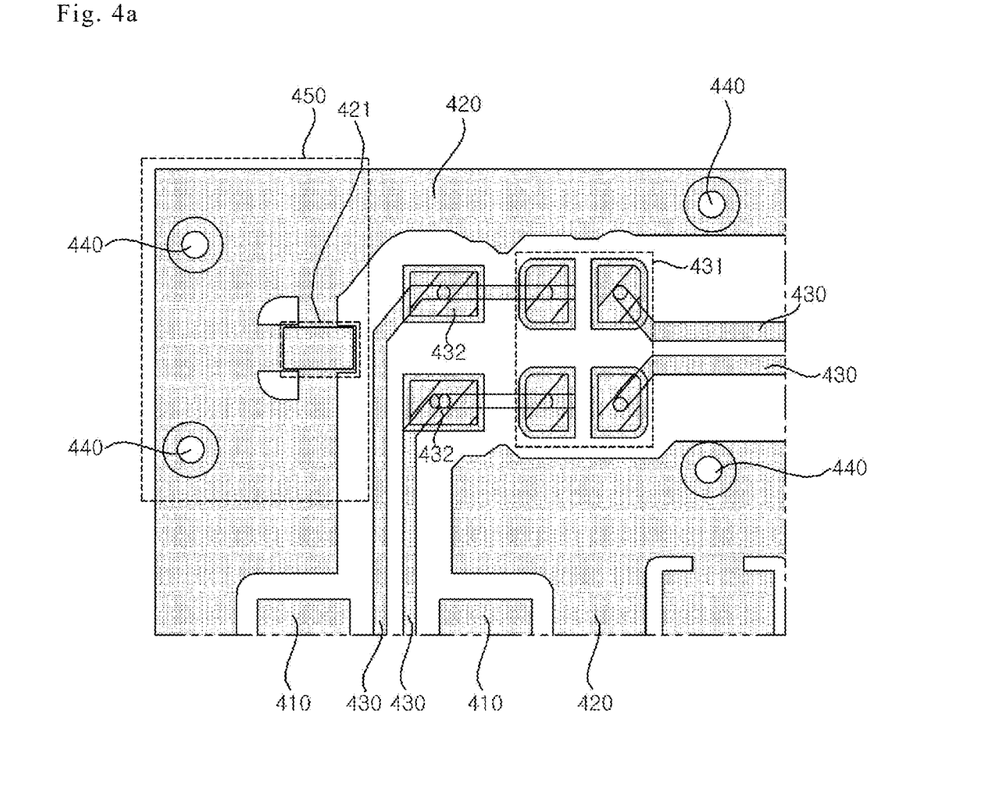
Figure 4B:
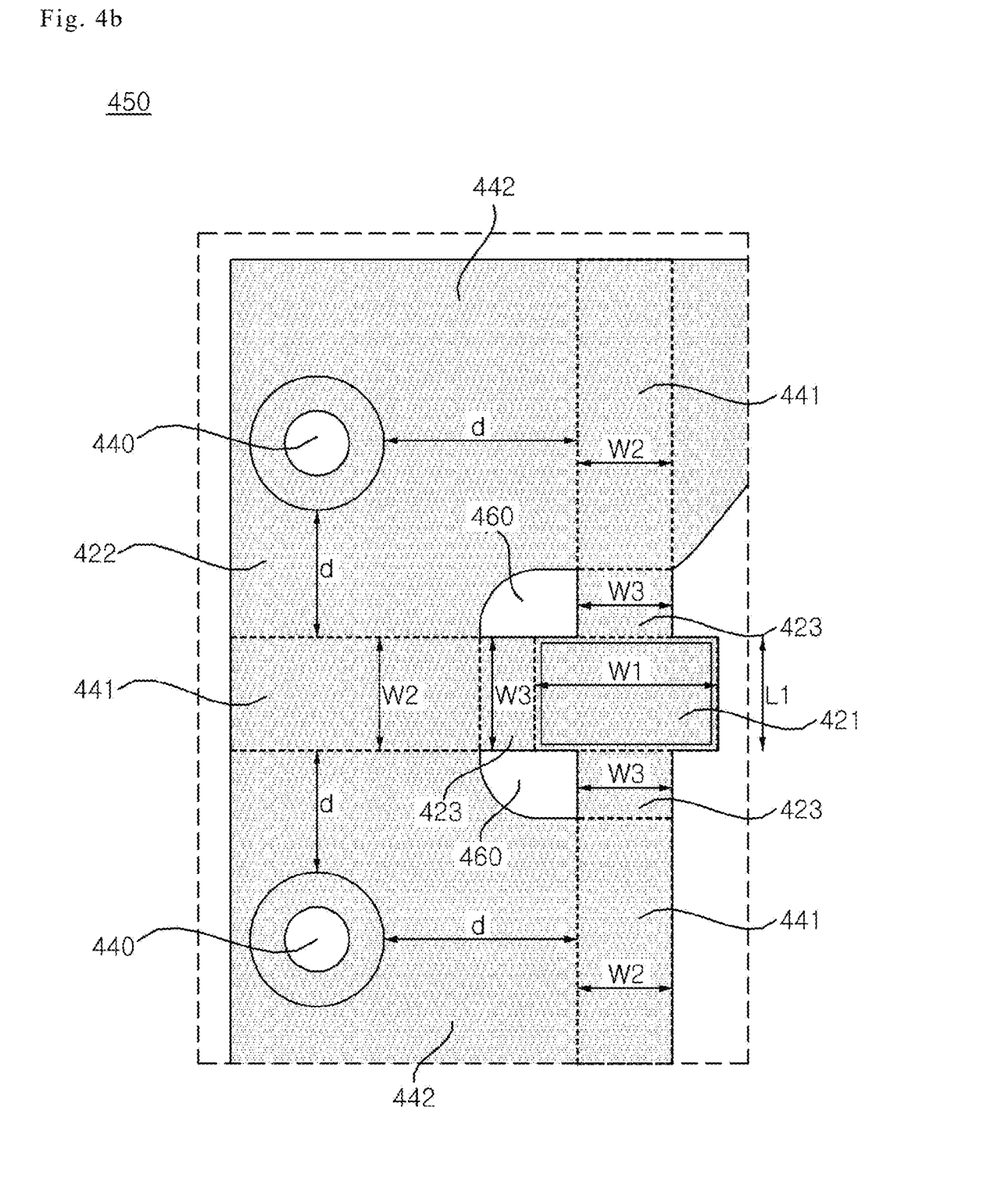

Referring to FIGS. 4A and 4B, the wiring pattern layers 210 and 240 of the PCB 200 according to an embodiment of the present disclosure may include a power line pattern 410, a ground pattern 420, and/or a signal line pattern 430.

The power line pattern 410, the ground pattern 420, and/or the signal line pattern 430 may be electrically disconnected from each other.

The power line pattern 410 may be electrically connected to the power pattern layer 220 through a first via hole (not shown).

The ground pattern 420 may be electrically connected to the ground pattern layer 230 through a second via hole 440.

The signal line pattern 430 may come into contact with a plurality of circuit elements, and the plurality of circuit elements may transmit signals to each other through the signal line pattern 430. For example, an application-specific integrated circuit (ASIC) chip may be mounted in a first region 431 of the signal line pattern 430, and may process signals transmitted through the signal line pattern 430.

Meanwhile, a detailed pattern 432 of the signal line pattern 430 may come into contact with at least one first end of the overvoltage cutoff element 300, and a first detailed pattern 421 of the ground pattern 420 may come into contact with a second end of the overvoltage cutoff element 300.

In this case, if an overvoltage greater than or equal to a predetermined voltage value is applied to the signal line pattern 430, a current flowing through the signal line pattern 430 may flow from the first end to the second end of the overvoltage cutoff element 300. In addition, the current flowing from the first end to the second end of the overvoltage cutoff element 300 may pass through the first detailed pattern 421 of the ground pattern 420 and the second via hole 440, to flow to the ground pattern layer 230.

The ground pattern 420 may include the first detailed pattern 421 coming into contact with the second end of the overvoltage cutoff element 300, a second detailed pattern 422 having a second via hole 440 formed therein, and at least one third detailed pattern 423 electrically connecting the first detailed pattern 421 and the second detailed pattern 422.

The second detailed pattern 422 may be formed to surround at least partially a periphery of the first detailed pattern 421. A plurality of third detailed patterns 423 may extend in a plurality of directions from the first detailed pattern 421 toward the second detailed pattern 422.

The third detailed pattern 423 may have a width W3 that is less than or equal to a greater value of a length L1 and a width W1 of the first detailed pattern 421. For example, the width W3 of each of the plurality of third detailed patterns 423 may be less than the length L1 or the width W1 of an edge in contact therewith, among edges of the first detailed pattern 421.

Among regions of the wiring pattern layers 210 and 240, a region 460 surrounded by the first detailed pattern 421, the second detailed pattern 422, and the plurality of third detailed patterns 433 may be a region coated with a solder for joining, so that the second end of the overvoltage cutoff element 300 may be joined to the PCB 200 by soldering.

In the entire region of the second detailed pattern 422, the second via hole 440 may be formed in a remaining region 442 except for first regions 441 of the second detailed pattern 422 that extend from each of the third detailed patterns 423 in a length direction of each of the third detailed patterns 423. Here, the length direction of each of the third detailed patterns 423 may refer to a direction from the first detailed pattern 421 toward the second detailed pattern 422. For example, the length direction of each of the third detailed patterns 423 may be a direction perpendicular to the width W3 of each of the third detailed patterns 423.

A width W2 of each of the first regions 441 of the second detailed pattern 422 may be greater than the width W3 of each of the third detailed patterns 423 corresponding thereto.

The second via hole 440 may be formed at a position spaced apart from all the first regions 441 by a predetermined distance d. That is, if the second via hole 420, connecting the ground pattern layer 230 and the ground pattern 420, is formed adjacent to the first detailed pattern 421 coming into contact with the second end of the overvoltage cutoff element 300, a current flowing to the second end of the overvoltage cutoff element 300 may not flow sufficiently to the ground pattern 420 and the ground pattern layer 230 due to the impedance depending on the length, area, thickness, and the like of the second via hole 420.

Accordingly, the second via hole 420 may be formed at a position spaced apart from the first region 441 by the predetermined distance d or more, so that the current flowing to the second end of the overvoltage cutoff element 300 may flow through the entire ground pattern 420.

Figure 5:
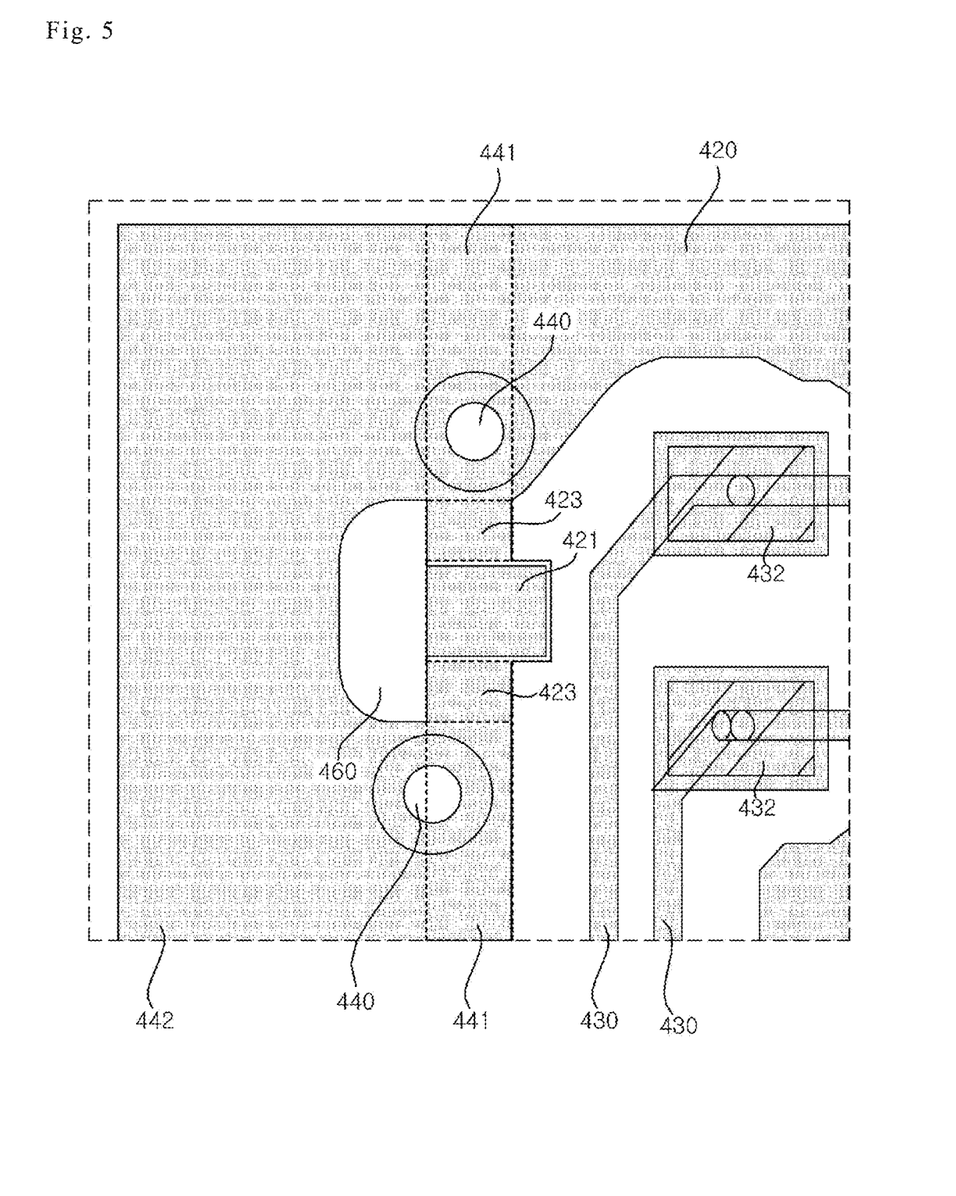

Meanwhile, referring to FIG. 5, if the second via hole 440 is formed in the first region 441 of the ground pattern 420 that is adjacent to the first detailed pattern 421 being in contact with the second end of the overvoltage cutoff element 300, i.e., as the second via hole 440 is located closer to the second end of the overvoltage cutoff element 300, a user may expect that a current flowing to the second end of the overvoltage cutoff element 300 flows sufficiently to the ground pattern layer 230 through the second via hole 440 according to a pattern design, thereby allowing a voltage, applied to the signal line pattern 430, to be clamped to a predetermined voltage value or less.

Figure 6:
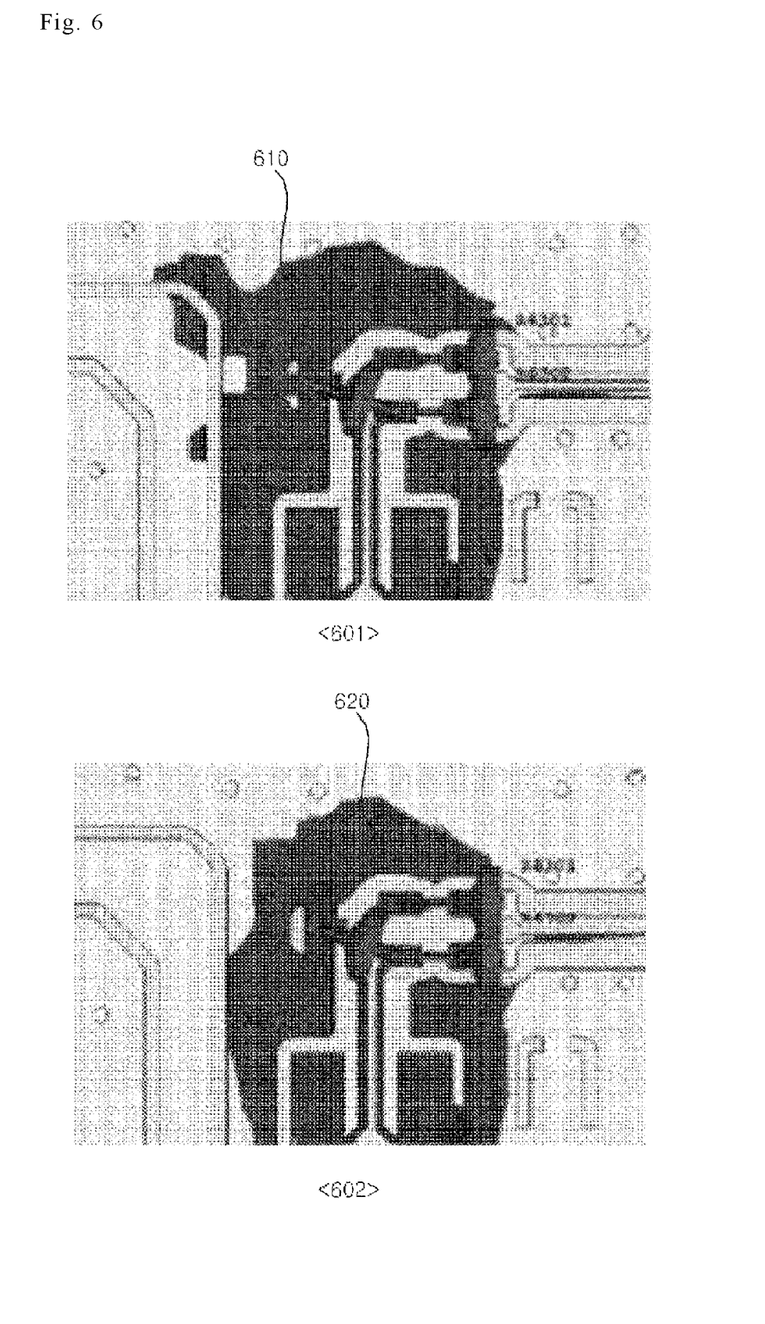

However, referring to a magnetic field region illustrated in FIG. 6, it can be confirmed that a magnetic field region 610, which is formed in a case (601) where the second via hole 440 is spaced apart from the first detailed pattern 421 by a predetermined distance or more, is larger than a magnetic field region 620 which is formed in a case (602) where the second via hole 440 is formed adjacent to the first detailed pattern 421.

That is, it can be understood that as more current flows, the magnetic field strength increases and a region affected by the magnetic field is also widened, such that in the case (601) where the second via hole 440 is formed in a remaining region 442 except for the first region 441 of the second detailed pattern 422 according to an embodiment of the present disclosure, more current flows to the ground pattern 420 and the ground pattern layer 230, as compared to the case (602) where the second via hole 440 is formed in the first region 441 adjacent to the first detailed pattern 421.

As described above, according to various embodiments of the present disclosure, by forming the via hole 440, connecting the ground pattern 420 and the ground pattern layer 230 of the wiring pattern layers 210 and 240, at a position spaced apart by a predetermined distance from one region 421 of the ground pattern 420 in which the overvoltage cutoff element 300 is disposed, the effect of impedance of the via hole 440 on the current flowing to the ground through the overvoltage cutoff element 300 may be reduced, such that when an overvoltage is applied, the current flowing through the overvoltage cutoff element 300 may flow sufficiently to the ground pattern layer 230.

Figure 7:
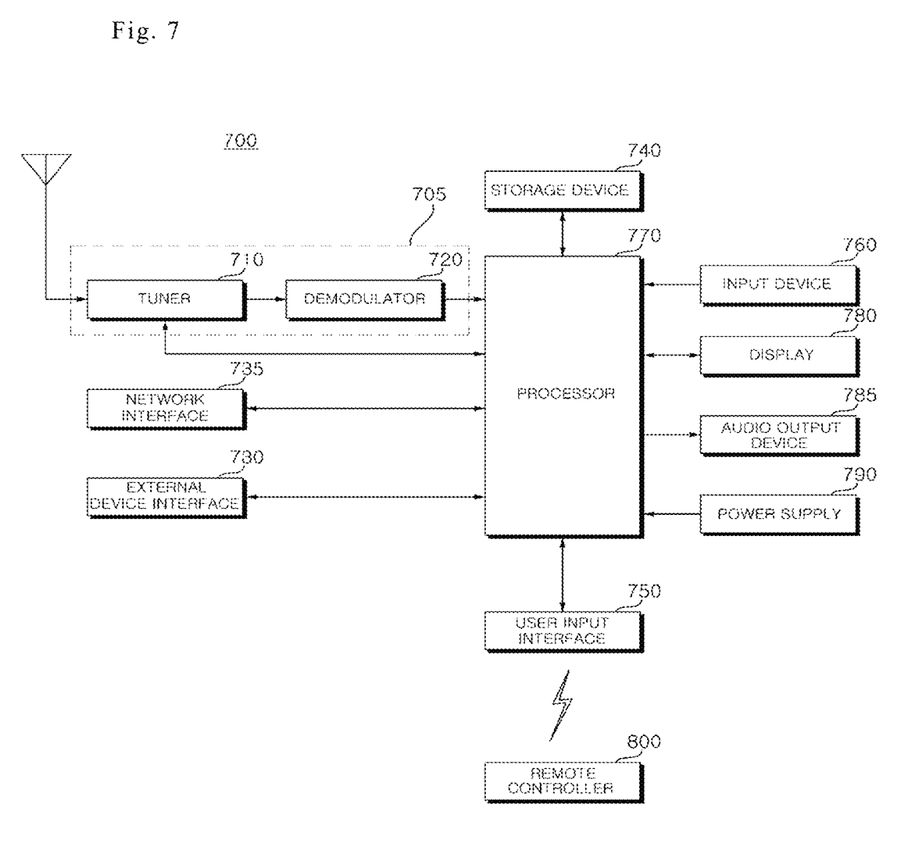
FIG. 7 is an internal block diagram illustrating an image display device according to an embodiment of the present disclosure.

FIG. 7 is an internal block diagram illustrating an image display device according to an embodiment of the present disclosure.

Referring to FIG. 7, an image display device 700 as an example of the home appliance 100b may include a broadcast receiver 705, an external device interface 730, a network interface 735, a storage device 740, a user input interface 750, an input device 760, a controller 770, a display 180, an audio output device 785, and/or a power supply 790.

The broadcast receiver 705 may include a tuner 710 and a demodulator 720.

Meanwhile, unlike the drawing, the image display device 100 may include only the broadcast receiver 705 and the external device interface 130, among the broadcast receiver 705, the external device interface 730, and the network interface 735. That is, the image display device 100 may not include the network interface 735.

The tuner 710 may select broadcast signals, corresponding to a channel selected by a user or all pre-stored channels, from among broadcast signals received through an antenna (not shown) or a cable (not shown). The tuner 710 may convert the selected broadcast signal into a middle-frequency signal, a baseband image, or a voice signal.

For example, if the selected broadcast signal is a digital broadcast signal, the tuner 710 converts the signal into a digital IF signal (DIF), and if the selected RF broadcast signal is an analog broadcast signal, the tuner 710 converts the signal into an analog baseband image or audio signal (CVBS/SIF). That is, the tuner 710 may process a digital broadcast signal or an analog broadcast signal. The analog baseband image or audio signal (CVBS/SIF) output from the tuner 710 may be directly input to the controller 770.

Meanwhile, the tuner 710 may sequentially select broadcast signals of all the broadcast channels, stored through a channel memory function, from among the received broadcast signals, and may convert the selected broadcast signal into a middle-frequency signal, a baseband image, or a voice signal.

Meanwhile, the tuner 710 may include a plurality of tuners for receiving broadcast signals of a plurality of channels. Alternatively, a single tuner that simultaneously receives broadcast signals of a plurality of channels is also available.

The demodulator 720 receives and demodulates a digital IF (DIF) signal converted by the tuner 710.

After performing demodulation and channel decoding, the demodulator 720 may output a stream signal (TS). In this case, the stream signal may be a signal obtained by multiplexing an image signal, voice signal, or data signal.

The stream signal output from the demodulator 720 may be input to the controller 770. After performing demultiplexing and image/audio signal processing, etc., the controller 770 may transmit the signal to a display device 200 through the external device interface 730.

The external device interface 730 may transmit or receive data with a connected external device (not shown). To this end, the external device interface 730 may include an A/V input/output device (not shown).

The A/V input/output device may transmit and receive signals with an external device. For example, the A/V input/output device may include an Ethernet terminal, USB terminal, a composite video banking sync (CUBS) terminal, a component terminal, a S-video terminal (analog), a digital visual interface (DVI) terminal, a high definition multimedia interface (HDMI) terminal, a mobile high-definition link (MHL) terminal, an RGB terminal, a D-SUB terminal, an IEEE 1394 terminal, an SPDIF terminal, a liquid HD terminal, and the like. Digital signals input through these terminals may be transmitted to the controller 770. Analogue signals input through the CVBS terminal and the S-video terminal may be converted into digital signals through an analogue/digital converter (not shown), to be transmitted to the controller 770.

The external device interface 730 may be connected by wire/wirelessly to the display device 200 such as a TV set, a monitor, etc., and may perform an input/output operation with the display device 200.

The external device interface 730 may include a wireless communication module (not shown) for short-range communication with an electronic device. The external device interface 730 may exchange data with a neighboring mobile terminal via the wireless communication module. For example, in the mirroring mode, the external device interface 730 may receive device information, running application information, an application image, and the like from the mobile terminal.

The external device interface 730 may perform short-range communication by using Bluetooth, radio frequency Identification (RFID) communication, Infrared Data Association (IrDA) communication, Ultra-Wideband (UWB), ZigBee, and the like.

The network interface 735 may provide an interface for connection with a wired/wireless network including the Internet. For example, the network interface 735 may receive content or data provided by the Internet or a content provider or a network operator through the network.

The network interface 735 may include a communication module (not shown) for connection with the wired/wireless network. For example, the network interface 735 may include a communication module for wireless LAN (WLAN) (Wi-Fi), wireless broadband (Wibro), world interoperability for microwave access (Wimax), high speed downlink packet access (HSDPA) and the like.

The network interface 735 may transmit or receive data with other users or other electronic devices through a connected network or another network linked to the connected network.

The storage device 740 may store programs for processing and controlling signals in the controller 770, and may also store a signal-processed image signal, voice signal, or data signal. For example, the storage device 740 may store application programs designed for the purpose of performing various operations executable by the controller 770, and may selectively provide some of the stored application programs in response to a request from the controller 770.

Programs and the like stored in the storage device 740 are not particularly limited as long as the programs may be executed by the controller 770.

The storage device 740 may function to temporarily store an image signal, a voice signal, or a data signal input from an external device through the external device interface 730.

While it is illustrated in FIG. 7 that the storage device 740 is provided separately from the controller 770, embodiments of the present disclosure are not limited thereto, and the storage device 740 may also be included in the controller 770.

The storage device 740 may include at least one of a volatile memory (e.g., DRAM, SRAM, SDRAM, etc.) or a non-volatile memory (e.g., Flash memory, Hard disk drive (HDD), Solid-state drive (SSD), etc.). According to various embodiments of the present disclosure, the storage device 740 and the memory may be used interchangeably.

The user input interface 750 may transmit a signal, input by a user, to the controller 770 or may transmit a signal from the controller 770 to the user. For example, the user input interface 750 may transmit/receive user input signals, such as power on/off, channel selection, screen setting, etc., to/from a remote controller 800, may deliver user input signals input through local keys (not shown), such as a power key, a channel key, a volume key, a set value, etc., may deliver user input signals, input from a sensor device (not shown) that senses user gestures, to the controller 770, or may transmit signals from the controller 770 to the sensor device.

An input device 760 may be provided on one side of a main body of the image display device 100. For example, the input device 760 may include a touch pad, a physical button, and the like.

The input device 760 may receive various user commands associated with the operation of the image display device 700 and may transmit a control signal, corresponding to an input command, to the controller 770. The input device 760 may transmit a control signal, corresponding to an input command, to the controller 770 through the user input interface 750.

The input device 760 may include at least one microphone (not shown) and may receive a user's speech through the microphone.

The controller 770 may include at least one processor and may control the overall operation of the image display device 700 by using the included processor. Here, the processor may be a general processor such as a central processing unit (CPU). Obviously, the processor may be a dedicated device, such as an ASIC, or other hardware-based processor.

The controller 770 may demultiplex the stream signal received from the tuner 710, the demodulator 720, the external device interface 730, or the network interface 735 into a number of signals, or may process the demultiplexed signals into video or audio data and output the video or audio data.

The video signal and/or the audio signal processed by the controller 770 may be transmitted to the display device 200 through the external device interface 730.

The audio signal processed by the controller 770 may be transmitted to the audio output device 785.

The audio output device 785 may include at least one speaker (not shown). The audio output device 785 may receive an audio signal processed by the controller 770, and outputs the audio signal as sound.

Although not illustrated in FIG. 7, the controller 770 may include a demultiplexer, a video processor, and the like.

Besides, the controller 770 may control the overall operation of the image display device 700. For example, the controller 770 may control the tuner 710 to tune in to an RF broadcast corresponding to a channel selected by the user or a prestored channel.

Meanwhile, the image display device 700 may further include an image capturing unit (not shown). The image capturing unit may capture images of a user. The image capturing unit may be implemented with one camera, but is not limited thereto, and may be implemented with a plurality of cameras. Meanwhile, the image capturing unit may be embedded in an upper portion of the image display device 700, or may be provided separately. Image information captured by the image capturing unit may be input to the controller 770.

The controller 770 may recognize a user's location based on the images captured by the image capturing unit. For example, the controller 770 may identify a distance (i.e., z-axis coordinates) between the user and the image display device 700.

The controller 770 may detect a user's gesture based on the images captured by the image capturing unit or the respective signals sensed by the sensor device, or a combination thereof.

The power supply 790 may supply power throughout the image display device 700. Particularly, the power supply 790 may supply power to the controller 770, which may be implemented in the form of a system on chip (SOC), the audio output device 785 for audio output, and the like.

Specifically, the power supply 790 may include a converter (not shown) for converting alternating current (AC) power into direct current (DC) power and a DC-DC converter (not shown) for changing a DC power level.

Meanwhile, the PCB 200 according to an embodiment of the present disclosure may be included in the external device interface 730.

Power supplied from the power supply 790 may be input to the power pattern layer 210 of the PCB 200.

The power line pattern 410 of the wiring pattern layers 210 and 240 may serve as a path through which power supplied from the power supply 790 is delivered to a connected external device through the power pattern layer 210.

The signal line pattern 430 of the wiring pattern layers 210 and 240 may serve as a path through which a signal, including data transmitted and received between the image display device 700 and the external device, is transmitted.

A remote controller 800 may transmit user input to the user input interface 750. To this end, the remote controller 800 may employ Bluetooth, radio frequency (RF) communication, infrared (IR) communication, Ultra-wideband (UWB), ZigBee, and the like. In addition, the remote controller 800 may receive an image signal, an audio signal or a data signal output from the user input interface 750 and the remote controller 800 may display the signal or output the signal as sound.

Meanwhile, the block diagram of the image display device 700 illustrated in FIG. 7 is merely a block diagram for an embodiment of the present disclosure. Components of the block diagram may be integrated, added or omitted according to specifications of the actually implemented image display device 700.

That is, two or more components may be combined or one component may be divided into two or more components as needed. Furthermore, a function executed in each block is for description of an embodiment of the present disclosure, and a specific operation or device of each block is not intended to limit the scope of the present disclosure.

The accompanying drawings are merely used to help easily understand embodiments of the present disclosure, and it should be understood that the technical features presented herein are not limited by the accompanying drawings. As such, the present disclosure should be construed to extend to any alterations, equivalents and substitutes in addition to those which are particularly set out in the accompanying drawings.

It will be apparent that, although the preferred embodiments have been illustrated and described above, the present disclosure is not limited to the above-described specific embodiments, and various modifications and variations can be made by those skilled in the art without departing from the gist of the appended claims. Thus, it is intended that the modifications and variations should not be understood independently of the technical spirit or prospect of the present disclosure.

The invention claimed is:

1. A printed circuit board comprising:
a power pattern layer;
a ground pattern layer; and
a wiring pattern layer on which a plurality of circuit elements are disposed,
wherein the wiring pattern layer comprises:
a signal line pattern through which an electrical signal is transmittable; and
a ground pattern electrically disconnected from the signal line pattern and having at least one via hole therein, wherein the at least via hole is electrically connected to the ground pattern layer,
wherein the signal line pattern is in contact with a first end of an overvoltage cutoff element of the plurality of circuit elements, wherein the overvoltage cutoff element is configured to operate in response to an overvoltage applied to the signal line pattern, the overvoltage being greater than or equal to a predetermined voltage,
wherein the ground pattern comprises:
a first detailed pattern in contact with a second end of the overvoltage cutoff element;
a second detailed pattern having the at least one via hole therein; and
a plurality of third detailed patterns electrically connecting the first detailed pattern and the second detailed pattern, and
wherein the at least one via hole is located at a remainder region of the second detailed pattern different from a plurality of first regions of the second detailed pattern that extend respectively from the plurality of third detailed patterns, each of the plurality of first regions extending along a length direction of the respective third detailed pattern.

2. The printed circuit board of claim 1, wherein at the remainder region of the second detailed pattern, the at least one via hole spaced apart from all of the plurality of first regions.

3. The printed circuit board of claim 1, wherein a width of each of the plurality of first regions is greater than or equal to a width of the respective third detailed pattern.

4. The printed circuit board of claim 1, wherein the overvoltage cutoff element comprises a Transient-voltage-suppression (TVS) diode.

5. The printed circuit board of claim 1, wherein:
the second detailed pattern surrounds a periphery of the first detailed pattern; and
the plurality of third detailed patterns extend along a plurality of directions from the first detailed pattern toward the second detailed pattern.

6. The printed circuit board of claim 1, wherein a width of one of the plurality of third detailed patterns is less than or equal to a greater of a length or a width of the first detailed pattern.

7. The printed circuit board of claim 1, wherein among regions of the wiring pattern layer, a region surrounded by the first detailed pattern, the second detailed pattern, and the plurality of third detailed patterns is coated with a solder for joining, so that the second end of the overvoltage cutoff element is joinable to the printed circuit board by soldering.

8. An image display device comprising:
a display;
an external device interface configured to transmit and receive data to and from an external device; and
a power supply configured to supply power,
wherein the external device interface comprises a printed circuit board having a power pattern layer to which the power supplied by the power supply is input, a ground pattern layer, and a wiring pattern layer on which a plurality of circuit elements are disposed,
wherein the wiring pattern layer comprises:
a power line pattern in which at least one first via hole electrically connected to the power pattern layer is located, wherein the power line pattern is connected to the external device;
a signal line pattern through which an electrical signal including the data is transmittable; and
a ground pattern in which at least one second via hole is located, wherein the at least one second via hole is electrically connected to the ground pattern layer,
wherein the signal line pattern is in contact with a first end of an overvoltage cutoff element of the plurality of circuit elements, wherein the overvoltage cutoff element is configured to operate in response to an overvoltage applied to the signal line pattern, the overvoltage being greater than or equal to a predetermined voltage,
wherein the ground pattern comprises:
a first detailed pattern in contact with a second end of the overvoltage cutoff element;
a second detailed pattern having the at least one second via hole therein; and
a plurality of third detailed patterns electrically connecting the first detailed pattern and the second detailed pattern, and
wherein the at least one second via hole is located at a remainder region of the second detailed pattern different from a plurality of first regions of the second detailed pattern that extend respectively from the plurality of third detailed patterns, each of the plurality of first regions extending along a length direction of the respective third detailed pattern.

* * * * *